United States Patent
Wan et al.

(10) Patent No.: US 8,486,723 B1
(45) Date of Patent: Jul. 16, 2013

(54) THREE AXIS MAGNETIC SENSOR DEVICE AND METHOD

(75) Inventors: Hong Wan, Plymouth, MN (US); Xiao "Charles" Yang, Cupertino, CA (US)

(73) Assignee: MCube Inc., San Jose, CA (US)

( * ) Notice: Subject to any disclaimer, the term of this patent is extended or adjusted under 35 U.S.C. 154(b) by 155 days.

(21) Appl. No.: 12/859,631

(22) Filed: Aug. 19, 2010

(51) Int. Cl.
*H01L 29/82* (2006.01)
*G11C 11/02* (2006.01)

(52) U.S. Cl.
USPC ............... 438/3; 257/421; 257/422; 257/423; 257/424; 257/425; 257/426; 257/427

(58) Field of Classification Search
USPC ....................... 438/3; 257/421–427
See application file for complete search history.

(56) References Cited

U.S. PATENT DOCUMENTS

| | | | |
|---|---|---|---|
| 3,614,677 A | 10/1971 | Wilfinger | |
| 4,954,698 A | 9/1990 | Yasunaga et al. | |
| 5,140,745 A | 8/1992 | McKenzie | |
| 5,157,841 A | 10/1992 | Dinsmore | |
| 5,173,597 A | 12/1992 | Anglin | |
| 5,493,769 A | 2/1996 | Sakai et al. | |
| 5,668,033 A | 9/1997 | Ohara et al. | |
| 6,046,409 A | 4/2000 | Ishii et al. | |
| 6,076,731 A | 6/2000 | Terrell | |
| 6,188,322 B1 | 2/2001 | Yao et al. | |
| 6,278,178 B1 | 8/2001 | Kwon et al. | |
| 6,483,172 B1 * | 11/2002 | Cote et al. | 257/639 |
| 6,534,726 B1 | 3/2003 | Okada et al. | |
| 6,855,572 B2 | 2/2005 | Jeung et al. | |
| 6,979,872 B2 | 12/2005 | Borwick, III et al. | |
| 7,145,555 B2 | 12/2006 | Taylor et al. | |
| 7,183,630 B1 | 2/2007 | Fogelson et al. | |
| 7,195,945 B1 | 3/2007 | Edelstein et al. | |
| 7,511,379 B1 | 3/2009 | Flint | |
| 7,708,189 B1 | 5/2010 | Cipriano | |
| 7,713,785 B1 | 5/2010 | Flint | |
| 7,861,422 B2 | 1/2011 | MacDonald | |
| 8,148,808 B2 | 4/2012 | Braden et al. | |
| 8,165,323 B2 | 4/2012 | Zhou | |
| 8,181,874 B1 | 5/2012 | Wang et al. | |
| 8,236,577 B1 | 8/2012 | Hsu et al. | |
| 8,250,921 B2 | 8/2012 | Nasiri et al. | |
| 8,259,311 B2 | 9/2012 | Petschko et al. | |
| 2001/0053565 A1 | 12/2001 | Khoury | |
| 2002/0134837 A1 | 9/2002 | Kishon | |
| 2004/0016995 A1 | 1/2004 | Kuo et al. | |
| 2004/0104268 A1 | 6/2004 | Bailey | |
| 2004/0207035 A1 * | 10/2004 | Witcraft et al. | 257/427 |
| 2005/0074147 A1 | 4/2005 | Smith et al. | |
| 2005/0247787 A1 | 11/2005 | Von Mueller et al. | |
| 2005/0252293 A1 | 11/2005 | Won et al. | |
| 2006/0081954 A1 * | 4/2006 | Tondra et al. | 257/421 |

(Continued)

OTHER PUBLICATIONS

Notice of Allowance for U.S. Appl. No. 12/945,087, mailed on Oct. 17, 2012, 8 pages.

(Continued)

*Primary Examiner* — Jami M Valentine
(74) *Attorney, Agent, or Firm* — Kilpatrick Townsend and Stockton LLP

(57) ABSTRACT

A method and structure for a three-axis magnetic field sensing device is provided. The device includes a substrate, an IC layer, and preferably three magnetic field sensors coupled to the IC layer. A nickel-iron magnetic field concentrator is also provided.

22 Claims, 10 Drawing Sheets

U.S. PATENT DOCUMENTS

| | | | |
|---|---|---|---|
| 2006/0141786 A1 | 6/2006 | Boezen et al. | |
| 2006/0168832 A1 | 8/2006 | Yasui et al. | |
| 2006/0274399 A1 | 12/2006 | Yang | |
| 2007/0181962 A1 | 8/2007 | Partridge et al. | |
| 2007/0200564 A1* | 8/2007 | Motz et al. .................. | 324/247 |
| 2007/0281379 A1 | 12/2007 | Stark et al. | |
| 2008/0014682 A1 | 1/2008 | Yang et al. | |
| 2008/0123242 A1 | 5/2008 | Zhou | |
| 2008/0211113 A1 | 9/2008 | Chua et al. | |
| 2009/0115412 A1 | 5/2009 | Fuse | |
| 2009/0321510 A1 | 12/2009 | Day et al. | |
| 2010/0075481 A1 | 3/2010 | Yang | |
| 2010/0302199 A1 | 12/2010 | Taylor et al. | |
| 2010/0307016 A1 | 12/2010 | Mayor et al. | |
| 2010/0312519 A1 | 12/2010 | Huang et al. | |
| 2011/0131825 A1 | 6/2011 | Mayor et al. | |
| 2011/0198395 A1 | 8/2011 | Chen | |
| 2011/0265574 A1 | 11/2011 | Yang | |
| 2011/0266340 A9 | 11/2011 | Block et al. | |
| 2012/0007597 A1 | 1/2012 | Seeger et al. | |
| 2012/0007598 A1 | 1/2012 | Lo et al. | |
| 2012/0215475 A1 | 8/2012 | Rutledge et al. | |

OTHER PUBLICATIONS

Notice of Allowance for U.S. Appl. No. 13/082,384, mailed Sep. 28, 2012, 8 pages.
Office Action for U.S. Appl. No. 12/913,440, mailed Sep. 10, 2012, 9 pages.
Notice of Allowance for U.S. Appl. No. 13/007,574, mailed on Apr. 6, 2012, 5 pages.
Non-Final Office Action for U.S. Appl. No. 12/945,087, mailed on Mar. 19, 2012, 5 pages.
Notice of Allowance for U.S. Appl. No. 12/940,023, mailed on Apr. 16, 2012, 8 pages.
Notice of Allowance for U.S. Appl. No. 12/940,020, mailed on Jan. 13, 2012, 9 pages.
Office Action for U.S. Appl. No. 12/940,026, mailed on Jul. 3, 2012, 24 pages.
Non-Final Office Action for U.S. Appl. No. 12/913,440; mailed on Sep. 10, 2012; 13 pages total.
International Search Report and Written Opinion of PCT Application No. PCT/US10/054567, mailed on Jan. 6, 2011, 7 pages total.
Non-Final Office Action for U.S. Appl. No. 12/983,309, mailed on Nov. 27, 2012, 11 pages.
Non-Final Office Action for U.S. Appl. No. 12/859,647, mailed on Oct. 25, 2012, 8 pages.
Non-Final Office Action for U.S. Appl. No. 12/859,672, mailed on Oct. 25, 2012, 16 pages.
Notice of Allowance for U.S. Appl. No. 13/007,585 mailed on Dec. 5, 2012, 8 pages.
Notice of Allowance for U.S. Appl. No. 12/957,222 mailed on Nov. 28, 2012, 9 pages.
Notice of Allowance for U.S. Appl. No. 12/945,846, mailed on Aug. 9, 2012, 10 pages.
Notification Concerning Transmittal of International Preliminary Report on Patentability (Chapter 1 of the Patent Cooperation Treaty) of PCT Application No. PCT/US2010/054567 dated May 12, 2012, 6 pages.

\* cited by examiner

THREE AXIS MAGNETIC SENSOR DEVICE AND METHOD

BACKGROUND OF THE INVENTION

This invention relates generally to integrated devices. More specifically, the invention provides an integrated transducer apparatus that can be used in combination with other Micro-electromechanical systems (MEMS) devices, but can have other uses as well. For example, the MEMS devices can provide an accelerometer, an angular rate sensor, a magnetic field sensor, a pressure sensor, a microphone, a humidity sensor, a temperature sensor, a chemical sensor, a biosensor, an inertial sensor, and others.

Research and development in integrated microelectronics have continued to produce progress in CMOS and MEMS technology. CMOS technology has become the predominant fabrication technology for integrated circuits (ICs). In layman's terms, the ICs are the "brains" of an integrated device and provide decision-making capabilities, while MEMS are the "eyes" and "arms" and provide the ability to sense and control the environment. Some examples of the widespread application of these technologies are the switches in radio frequency (RF) antenna systems, such as those in the iPhone™ or iPad™ device by Apple, Inc. of Cupertino, Calif. and the Blackberry™ phone by Research In Motion Limited of Waterloo, Ontario, Canada. They are also used to provide accelerometers in sensor-equipped game devices, such as those in the Wii™ controller manufactured by Nintendo Company Limited of Japan. Though they are not always easily identifiable, these technologies are becoming more prevalent every day.

Beyond consumer electronics, use of IC and MEMS technology has applications through modular measurement devices such as accelerometers, angular rate sensors, actuators, and other sensors. In conventional vehicles, accelerometers and angular rate sensors are used to deploy airbags and trigger dynamic stability control functions, respectively. MEMS angular rate sensors can also be used for image stabilization systems in video and still cameras, automatic steering systems in airplanes and guided munitions, or the like. MEMS can also be in the form of biological MEMS (Bio-MEMS) that can be used to implement biological and/or chemical sensors for Lab-On-Chip applications. Such applications may integrate one or more laboratory functions on a single millimeter-sized chip. Other applications include Internet and telephone networks, security and financial applications, and health care and medical systems. As described previously, ICs and MEMS can be used to practically engage in various type of environmental interaction.

Although highly successful, ICs and in particular magnetic field sensors and MEMS still have limitations. Similar to IC development, magnetic sensor and MEMS development, which focuses on increasing performance, reducing size, and decreasing cost, continues to be challenging. Additionally, applications of magnetic sensors and MEMS often require increasingly complex microsystems that desire greater computational power. Unfortunately, such applications generally do not exist. These and other limitations of conventional magnetic sensors, MEMS, and ICs may be further described throughout the present specification and more particularly below.

From the above, it is seen that techniques for improving operation of integrated circuit devices, magnetic field sensors, and MEMS are highly desired.

BRIEF SUMMARY OF THE INVENTION

According to embodiments of the present invention, techniques generally related to integrated devices and systems are provided. In particular, embodiments of the present invention provide a method and structure for fabricating a three-axis magnetic field sensing device. More specifically, embodiments of the present invention provide methods for forming at least a first, second, and third magnetic field sensor element overlying a substrate member with field concentrator(s) and operably coupled to an integrated circuit (IC) layer. Merely by way of example, the magnetic field sensor elements can include ordinary magneto-resistive (OMR) device(s), anisotropic magneto-resistive (AMR) devices, giant magneto-resistive (GMR) device(s), tunnel junction magneto-resistive (TMR), or others. Additionally, other applications include at least a sensor application or magnetic field sensing applications, system applications, among others. But it will be recognized that the invention has a much broader range of applicability.

Embodiments of the present invention include a method including providing a substrate having a surface region. The substrate can have at least one portion removed via an etching process or other processes. At least one nickel iron (NiFe) material can be formed overlying at least a portion of the surface region. At least one dielectric material and at least one metal material can be formed overlying the surface region as well. The dielectric material(s) and metal material(s) can form magnetic field sensor elements, an IC layer, or other magnetic field sensor device component. A passivation material can be formed overlying these other materials.

Embodiments of the device can have a substrate member including a surface region. The substrate can have at least one portion removed via an etching process or other processes. An IC layer can be spatially disposed overlying at least a portion of the surface region of the substrate member. A first, second, and third magnetic field sensor element can be operably coupled to the IC layer. Each of the magnetic field sensor elements can include a first material and be configured to detect at least in single direction. Also, at least one magnetic field concentrator can be spatially disposed overlying at least a portion of the surface region.

Many benefits are achieved by way of embodiments the present invention over conventional techniques. For example, embodiments of the present technique provide an easy to use process to integrate a three-axis magnetic field sensor on a single die. In some embodiments, the method provides higher device yields in dies per wafer with the integrated approach. Additionally, the method provides a process and system that are compatible with conventional semiconductor and MEMS process technologies without substantial modifications to conventional equipment and processes. Preferably, the invention provides for an improved magnetic field sensor or magnetic field sensor device system and related applications for a variety of uses. In one or more embodiments, the present invention provides for all magnetic field sensors, and related applications, which may be integrated on one or more semiconductor device structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

These diagrams are merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to embodiments of the present invention, techniques related generally to integrated devices and systems are provided. In particular, embodiments of the present invention provide methods and structures for a three-axis magnetic field sensing device. More specifically, embodiments of the present invention provide methods for forming at least one a first, second, and third magnetic field sensor element overlying a substrate member with field concentrator(s) and operably coupled to an integrated circuit (IC) layer. Merely by way of example, the magnetic field sensor elements can include ordinary magneto-resistive (OMR) device(s), anisotropic magneto-resistive (AMR) devices, giant magneto-resistive (GMR) device(s), tunnel-junction magneto-resistive (TMR), or others. Additionally, other applications include at least a sensor application or magnetic field sensing applications, system applications, among others.

Figure 1:
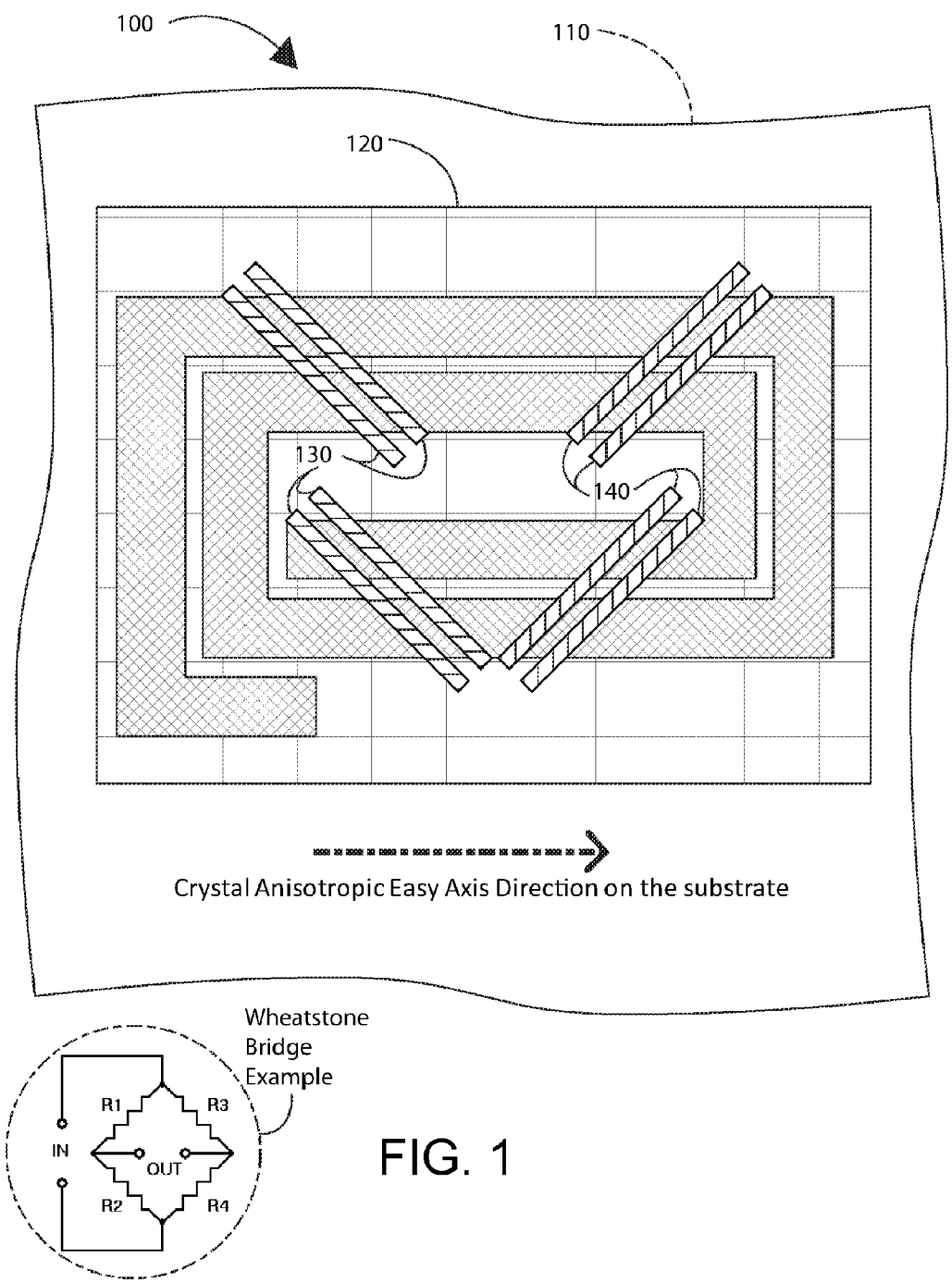
FIG. 1 is a simplified top diagram of a device for sensing magnetic fields according to an embodiment of the present invention.

FIG. 1 is a simplified top diagram of a device for sensing magnetic fields according to an embodiment of the present invention. This diagram, which can represent a partially formed three-axis magnetic field sensor device or a two-axis magnetic field sensor device, is merely an example, which should not unduly limit the scope of the claims herein. One of ordinary skill in the art would recognize many other variations, modifications, and alternatives. As shown, device 100 includes a substrate 110, an integrated circuit (IC) layer 120, a first magnetic field sensor element 130, and a second magnetic field sensor element 140.

In an embodiment, substrate 110 can have a surface region. In a specific embodiment, substrate 110 can include a buried oxide (BOX) substrate. Substrate 110 can include a substrate-on-insulator (SOI) substrate. In another specific embodiment, substrate 110 can include an epitaxial (EPI) material. In further embodiments, substrate 110 can have a silicon, single crystal silicon, or polycrystalline silicon material. Substrate 110 can also include metals, dielectrics, polymers, and other materials and combinations thereof.

In an embodiment, IC layer 120 can be formed overlying at least one portion of the surface region. In a specific embodiment, IC layer 120 can include an application specific integrated circuit (ASIC) layer, or other type of IC layer or combination thereof. Also, IC layer 120 can include at least one IC device, CMOS device, or other device. IC layer 120 can be coupled to the first and second magnetic field sensor elements 130 and 140.

In an embodiment, first magnetic field sensor element(s) 130 and second magnetic field sensor element 140 can be formed overlying at least one portion of the surface region. Magnetic field sensor elements 130 and 140 can include ordinary magneto-resistive (OMR) device(s), anisotropic magneto-resistive (AMR) device(s), giant magneto-resistive (GMR) device(s), or tunnel junction magneto-resistive (TMR) device(s). Elements 130 and 140 can also be other types of magnetic field sensor devices, sensors, or combinations thereof. In a specific embodiment, magnetic field sensor elements 130 and 140 can include thin film devices that can be deposited overlying at least one portion of the surface region. The thin film device(s) can be deposited by a sputtering process or an electric plating process. In a specific embodiment, magnetic field sensor elements 130 and 140 are formed as a Wheatstone bridge, a half bridge, or a single element configuration. In an embodiment, magnetic field sensor elements 130 and 140 can include at least one layer of dielectric material and/or metal material.

Figure 2:
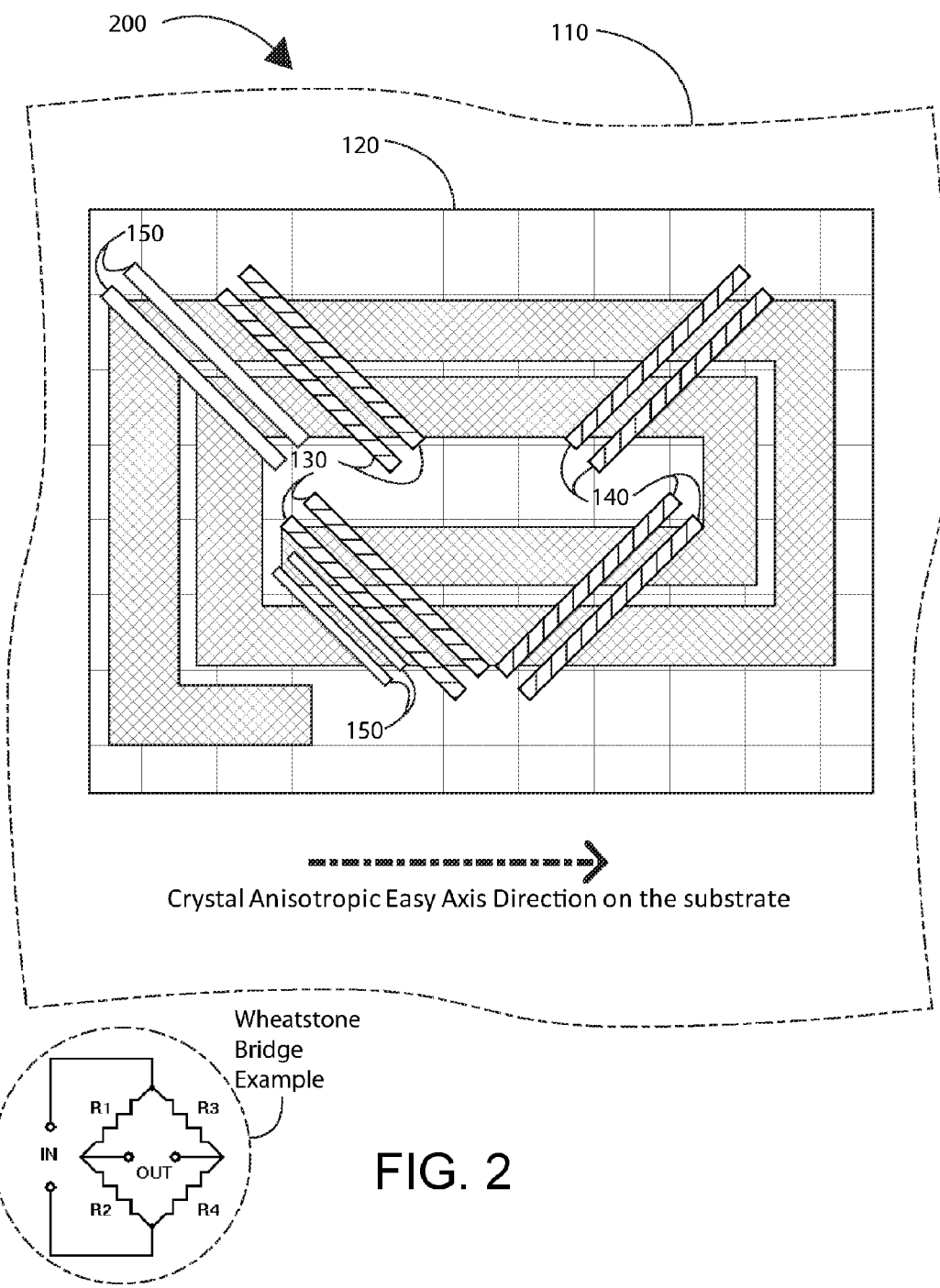
FIG. 2 is a simplified top diagram of a device for sensing magnetic fields according to an embodiment of the present invention.

FIG. 2 is a simplified top diagram of a device for sensing magnetic fields according to an embodiment of the present invention. This diagram, which can represent a three-axis magnetic field sensor device, is merely an example, which should not unduly limit the scope of the claims herein. One of ordinary skill in the art would recognize many other variations, modifications, and alternatives. As shown, device 200 includes a substrate 110, an integrated circuit (IC) layer 120, at least one first magnetic field sensor element 130, at least one second magnetic field sensor element 140, and at least one third magnetic field sensor element 150. FIG. 2 shows the third magnetic field sensor element in a configuration that is parallel to the first magnetic field sensor element(s).

In an embodiment, substrate 110 can have a surface region. In a specific embodiment, substrate 110 can include a buried oxide (BOX) substrate. Substrate 110 can include a substrate-on-insulator (SOI) substrate. In another specific embodiment, substrate 110 can include an epitaxial (EPI) material. In further embodiments, substrate 110 can have a silicon, single crystal silicon, or polycrystalline silicon material. Substrate 110 can also include metals, dielectrics, polymers, and other materials and combinations thereof.

In an embodiment, IC layer 120 can be formed overlying at least one portion of the surface region. In a specific embodiment, IC layer 120 can include an application specific integrated circuit (ASIC) layer, or other type of IC layer or combination thereof. Also, IC layer 120 can include at least one IC device, CMOS device, or other device. IC layer 120 can be coupled to the magnetic field sensor elements 130, 140, and 150.

In an embodiment, first magnetic field sensor element(s) 130, second magnetic field sensor element 140, and third magnetic field sensor element 150 can be formed overlying at least one portion of the surface region. Magnetic field sensor elements 130, 140, and 150 can include ordinary magneto-resistive (OMR) device(s), anisotropic magneto-resistive (AMR) device(s), giant magneto-resistive (GMR) device(s), or tunnel junction magneto-resistive (TMR) device(s). Elements 130, 140, 150 can also be other types of magnetic field sensor devices, sensors, or combinations thereof. In a specific embodiment, magnetic field sensor elements 130, 140, and 150 can include thin film devices that can be deposited overlying at least one portion of the surface region. The thin film device(s) can be deposited by a sputtering process or an electric plating process. In a specific embodiment, magnetic field sensor elements 130, 140, and 150 are formed as a Wheatstone bridge, a half bridge, or a single element. In an embodiment, magnetic field sensor elements 130, 140, 150 can include at least one layer of dielectric material and/or metal material.

Integrating a three-axis magnetoresistive (MR) sensor device on a single chip has been challenging because thin film MR sensors are only sensitive to the magnetic field parallel to the plane of the thin film. This limitation is due to the strong shape anisotropic field in the out of plane direction. The magnetic thin film also has a crystal anisotropic field, which makes the crystal anisotropic easy direction a preferred configuration for the sensors.

In an embodiment, the design of a single chip 3-axis magnetic sensor device can be based on magneto-resistive technologies including, but not limited to, Anisotropic Magneto-Resistive (AMR), Giant Magneto-Resistive (GMR), and Tunnel Magneto-Resistive (TMR) effects. In a specific embodiment, a vertical field can be channeled to magnetic thin film plane through a field (flux) concentrator, which can be used effectively as a Z-field sensor.

The Z-field sensor can be designed in any orientation on the thin film plane. For example, the sensor can be designed to have the best sensor performance, such as being configured in a sensitive direction on the crystal hard axis to have lower electric/magnetic noise, or aligned with X or Y sensors for easy calibration. The Z-axis sensor can be designed to be a gradient magnetic field sensor, making it highly insensitive to any uniformly applied field on the horizontal plane. This design can cause the Z-axis sensor's output to be proportional to the Z-axis field channeled through field (flux) concentrator. However, due to manufacturing imperfection and tolerance, the four elements (or two elements for half bridge) of Z-axis sensor might not be perfectly identical or symmetrical to the field (flux) concentrator elements. In some cases, the field (flux) concentrator element may not be identical, which may require calibration of the concentrators to the substrate because the horizontal field may influence the Z-axis sensor performance.

For horizontal X-Y configurations, the sensors can be configured as Wheatstone bridges or half bridges with four elements. The sensitive direction of the x-axis sensor is 45 degrees away from the crystal anisotropic easy axis direction of the substrate, and the sensitive direction of the y-axis sensor is −45 degrees of the crystal easy axis. The X and Y sensors can be configured to be symmetrical to the crystal hard axis in order to match the sensor's sensitivities.

Figure 3:
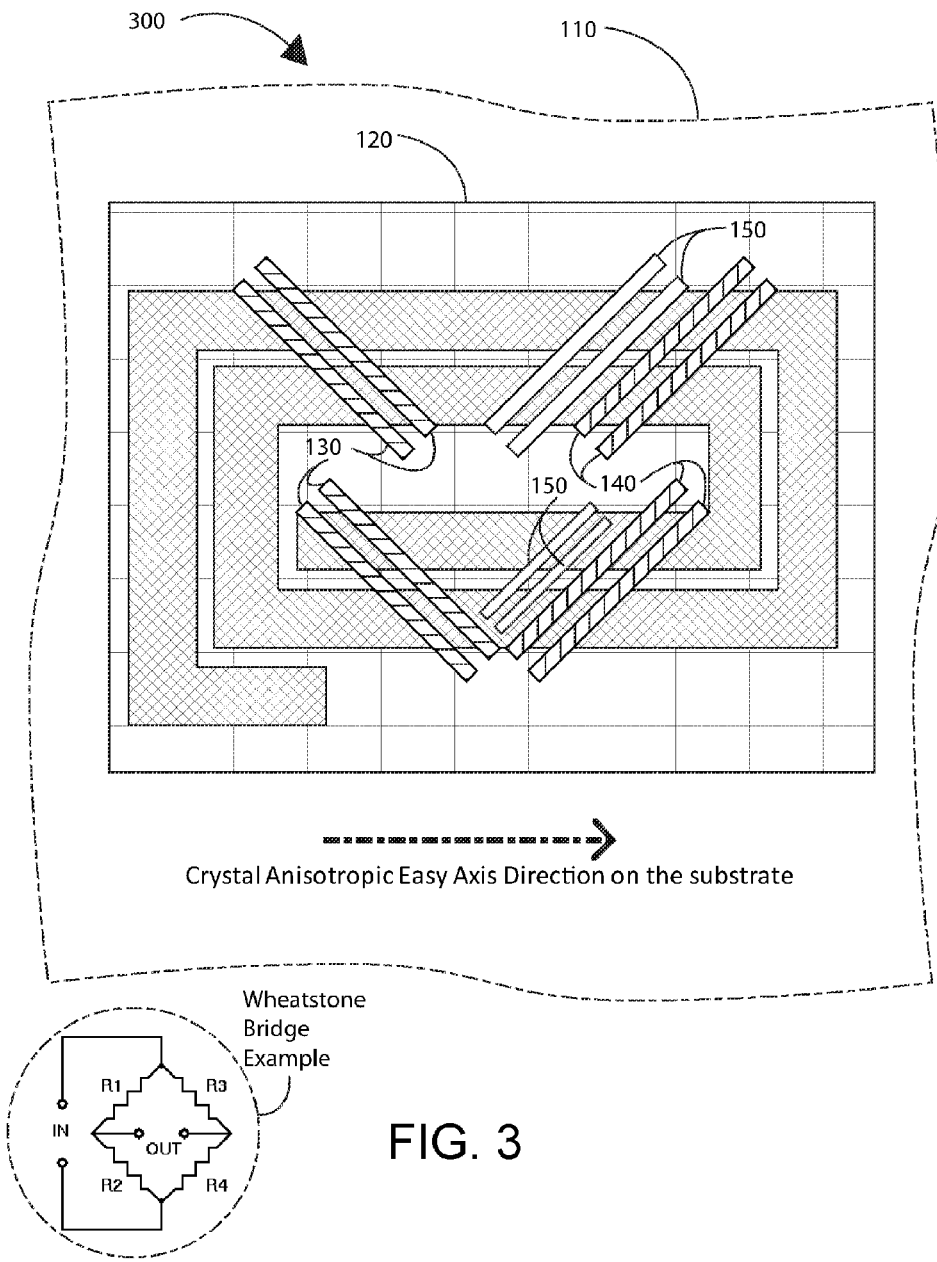
FIG. 3 is a simplified top diagram of a device for sensing magnetic fields according to an embodiment of the present invention.

By using a single Set/Reset strap (shown as the material formed in a spiral shape underneath the sensors in FIGS. 1-3) for X-Y sensors, the magnetization of both X and Y sensors will be aligned upon initialization. As a current pulse passes through the Set/Reset strap, a localized magnetic field is generated on the sensor elements right above or below the strap. In various embodiments, the pulse current is strong enough to align magnetic domains in the MR sensor elements substantially to its field direction. Upon releasing the pulse current, magnetization of X-Y sensors relax to their easy axis directions of their total anisotropic field, and form sensitivities in the x-axis or y-axis direction. The X-Y Sensors are field sensors, which means the output voltage is proportional the magnetic field strength in their sensitive directions.

Z sensor can share the set/reset strap with the X-Y sensors. Z sensor is a gradient sensor, which means the output voltage is proportional to the field differences along its sensitive direction. Z sensor can be parallel to the x-axis sensor, the y-axis sensor, or in the different orientation altogether.

FIG. 3 is a simplified top diagram of a device for sensing magnetic fields according to an embodiment of the present invention. This diagram, which can represent a three-axis magnetic field sensor device, is merely an example, which should not unduly limit the scope of the claims herein. One of ordinary skill in the art would recognize many other variations, modifications, and alternatives. As shown, device 300 includes a substrate 110, an integrated circuit (IC) layer 120, at least one first magnetic field sensor element 130, at least one second magnetic field sensor element 140, and at least one third magnetic field sensor element 150. FIG. 3 shows the third magnetic field sensor element(s) 150 in a configuration that is parallel to the second magnetic field sensor element(s) 140. A detailed description of the components of device 300 can be found in the description above for FIG. 2.

Figure 4:
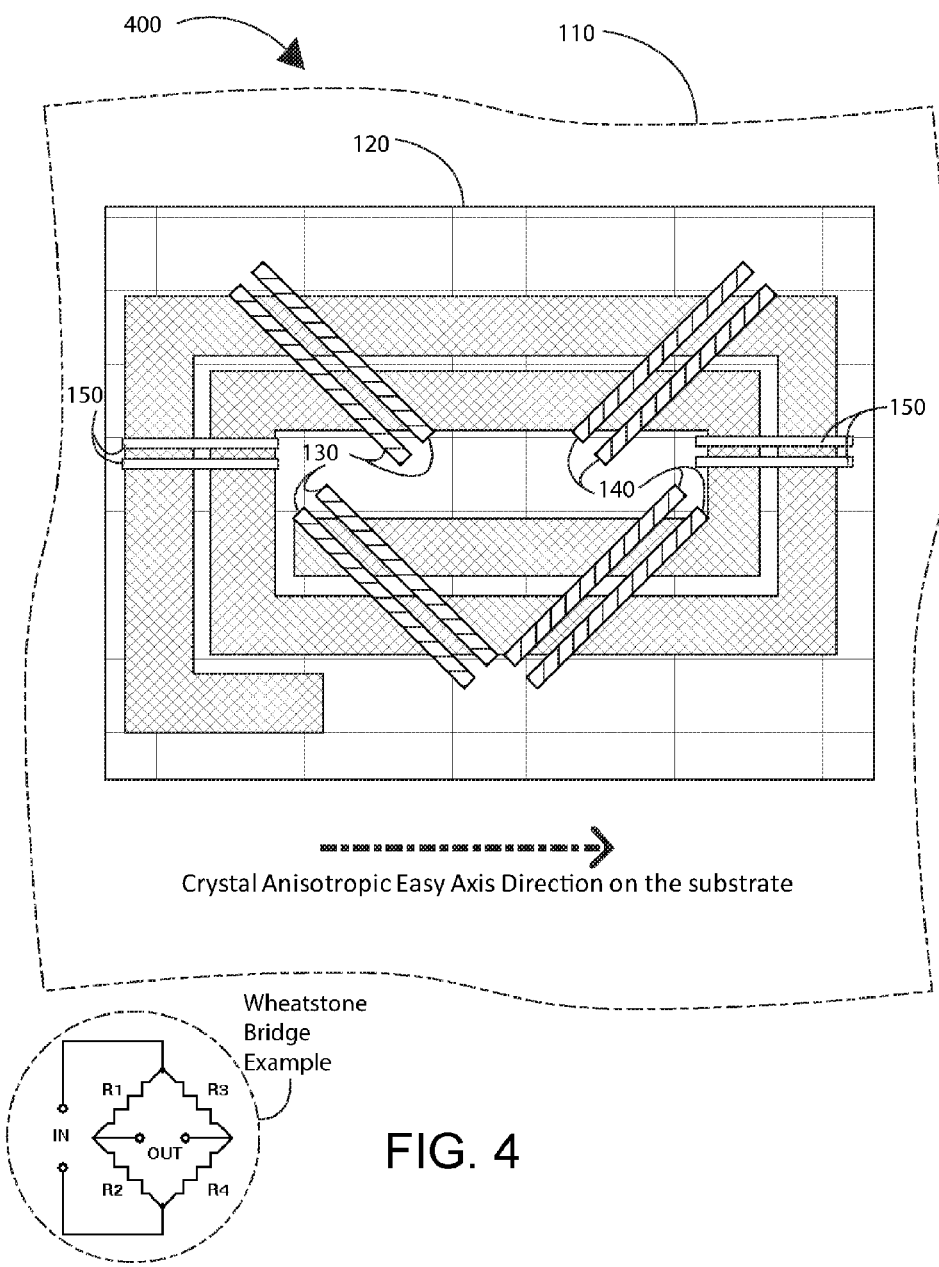
FIG. 4 is a simplified top diagram of a device for sensing magnetic fields according to an embodiment of the present invention.

FIG. 4 is a simplified top diagram of a device for sensing magnetic fields according to an embodiment of the present invention. This diagram, which can represent a three-axis magnetic field sensor device, is merely an example, which should not unduly limit the scope of the claims herein. One of ordinary skill in the art would recognize many other variations, modifications, and alternatives. As shown, device 400 includes a substrate 110, an integrated circuit (IC) layer 120, a first magnetic field sensor element 130, a second magnetic field sensor element 140, and a third magnetic field sensor element 150. FIG. 4 shows the third magnetic field sensor element in a configuration that is aligned to a crystal easy axis. A detailed description of the components of device 400 can be found in the description above for FIG. 2.

Figure 5:
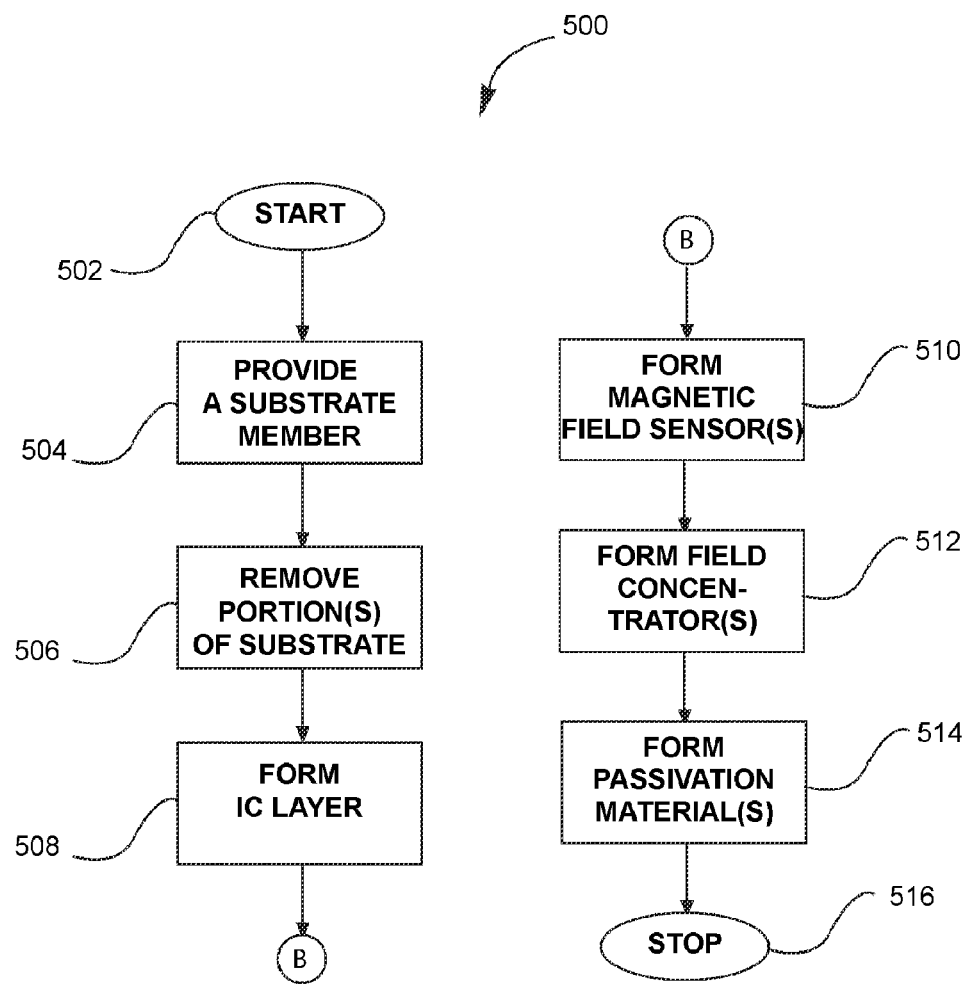
FIG. 5 is a simplified flow diagram of a method for fabricating a device for sensing magnetic fields according to an embodiment of the present invention.

FIG. 5 is a simplified flow diagram illustrating a method of fabricating a device for sensing magnetic fields according to an embodiment of the present invention.

As shown in FIG. 5, the present method can be briefly outlined below.

1. Start;
2. Provide a substrate member having a surface region;
3. Remove at least one portion of the substrate
4. Form an integrated circuit (IC) layer;
5. Form magnetic field sensor elements;
6. Form at least one field concentrator;
7. Form passivation material(s); and
8. Stop.

These steps are merely examples and should not unduly limit the scope of the claims herein. As shown, the above method provides a way of fabricating a three-axis magnetic field sensing device, which can be monolithically integrated with signal condition ASIC(s), according to embodiments of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 5, method 500 begins at start, step 502. The present embodiment provides a fabrication method for forming a three-axis magnetic field sensing device monolithically integrated, which can be integrated with its signal condition ASIC(s). Many benefits are achieved by way of the present invention over conventional techniques. For example, the present technique provides an easy to use process that relies upon conventional semiconductor and MEMS technologies. In some embodiments, the method provides a low cost way to manufacture a three-axis magnetic field sensor on a single die. Additionally, embodiments of the method provide a process and system that are compatible with conventional process technology without substantial modifications to conventional equipment and processes. Preferably, embodiments of the invention provide for an improved sensors and electronic devices and related methods for a variety of uses. Depending upon the embodiment, one or more of these benefits may be achieved. These and other benefits will be described in more throughout the present specification and more particularly below.

Following step 502, fabrication method 500 involves providing a substrate having a surface region, step 504. The substrate can include a substrate-on-insulator (SOI) substrate. In specific embodiment, the substrate can include an epitaxial (EPI) material. In further embodiments, the substrate can have a silicon, single crystal silicon, or polycrystalline silicon material. The substrate can also include metals, dielectrics, polymers, and other materials and combinations thereof. Those skilled in the art will recognize other variations, modifications, and alternatives.

At least one portion of the substrate can be removed, step 506 to form lateral surfaces. In an embodiment, the removal of portion(s) of the substrate can include a wet etching, dry etching, or mechanical process. In a specific embodiment, the removal of portion(s) of the substrate can include a deep reactive-ion etching (DRIE) process. The removal process can include other processes and combinations thereof.

An integrated circuit (IC) layer can be formed overlying at least one portion of the surface region, step 508. In a specific embodiment, the IC layer can include an application specific integrated circuit (ASIC) layer, or other type of IC layer or combination thereof. Also, the IC layer can include at least one IC device, CMOS device, or other device. In various embodiments, the IC layer can be coupled to the magnetic field sensor elements.

In an embodiment, magnetic field sensor elements can be formed overlying at least one portion of the surface region, step 510. In a specific embodiment, the magnetic field sensor elements can include at least one first magnetic field sensing element, at least one second magnetic field sensing element, and at least one third magnetic field sensing element. These magnetic field sensor elements can include ordinary magneto-resistive (OMR) device(s), anisotropic magneto-resistive (AMR) device(s), giant magneto-resistive (GMR) device(s), or tunnel junction magneto-resistive (TMR) device(s). Also, these magnetic field sensor elements can be manufactured in one process or a combination of processes. These elements can also be other types of magnetic field sensor devices, sensors, or combinations thereof. In a specific embodiment, these magnetic field sensor elements can include thin film devices that can be deposited overlying at least one portion of the surface region. The thin film device(s) can be deposited by a sputtering process or an electric plating process. In a specific embodiment, these magnetic field sensor elements can be formed as a Wheatstone bridge, a half bridge, or a single element. In an embodiment, these magnetic field sensor elements can include at least one layer of dielectric material and/or metal material.

After forming the magnetic field sensor element(s), at least one magnetic field concentrator can be formed overlying at least one portion of the surface region, step 512. In a specific embodiment, the magnetic field concentrator(s) can include a nickel-iron material. The magnetic field concentrator(s) can also include other materials, compositions, and combinations thereof. The magnetic field concentrator(s) can include magnetic field concentrator(s) that includes a permalloy material, which can be a nickel iron (NiFe) or a nickel iron cobalt (NiFeCo) material. In various embodiments, permalloy may include a nickel iron magnetic alloy typically having about 20% iron and 80% nickel content." In a specific embodiment, the magnetic field concentrator(s) can be formed via an electric plating process or sputtering process. Then, a passivation material can be formed overlying at least the magnetic field sensor element(s), step 514. As stated, there can be other variations, modifications, and alternatives.

The above sequence of processes provides a fabrication method for forming sensors or electronic devices integrated with field concentrators according to an embodiment of the present invention. As shown, embodiments of the method disclose a combination of steps including providing a substrate, removing at least one portion of the substrate, forming an insulating material overlying at least one portion of the substrate, forming magnetic field sensor element(s) and magnetic field concentrator(s), and forming a passivation material overlying at least the magnetic field sensor element(s). Other alternatives can also be provided where steps are added, one or more steps are removed, or one or more steps are provided in a different sequence without departing from the scope of the claims herein. Further details of the present method can be found throughout the present specification.

Figure 6:
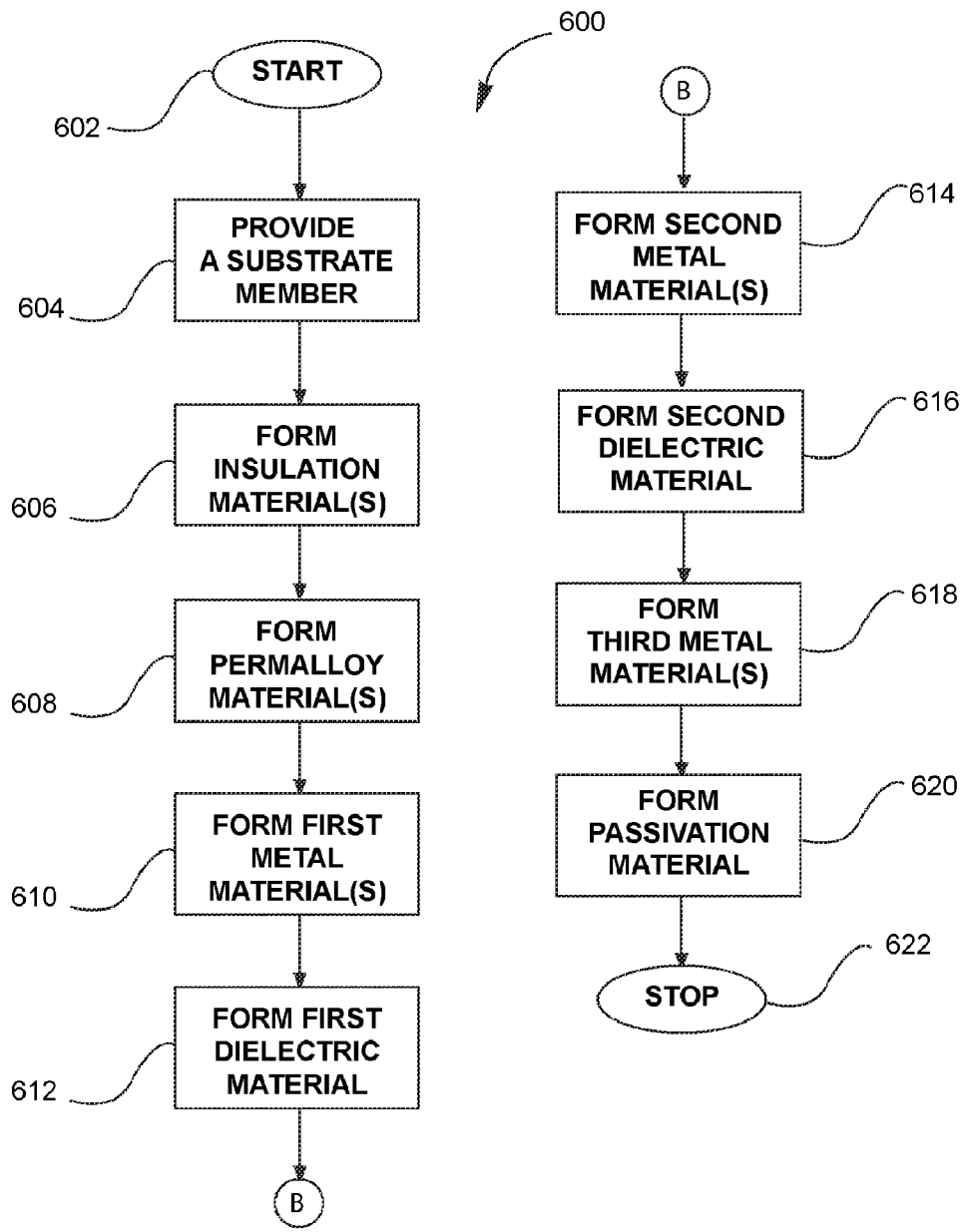
FIG. 6 is a simplified flow diagram of a method for fabricating a device for sensing magnetic fields according to an embodiment of the present invention.

FIG. 6 is a simplified flow diagram illustrating a method of fabricating a device for sensing magnetic fields.

As shown in FIG. 6, the present method can be briefly outlined below.

1. Start;
2. Provide a substrate member having a surface region;
3. Form at least one insulation material overlying the surface region;
4. Form at least one permalloy material overlying the insulation material(s);
5. Form at least one first metal material overlying the permalloy material(s);
6. Form a first dielectric material overlying the first metal material(s);
7. Form at least one second metal material overlying the first dielectric;
8. Form a second dielectric material overlying the second metal material(s);
9. Form at least one third metal material overlying the second dielectric material;
10. Form a passivation material overlying the third metal material; and
11. Stop.

These steps are merely examples and should not unduly limit the scope of the claims herein. As shown, the above method provides a way of fabricating a three-axis magnetic field sensing device according to embodiments of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 6, method 600 begins at start, step 602. The present embodiment provides a fabrication method for forming a three-axis magnetic field sensing device. Many benefits are achieved by way of the present invention over conventional techniques. For example, the present technique provides an easy to use process that relies upon conventional semiconductor and MEMS technologies. In some embodiments, the method provides a low cost way to manufacture a three-axis magnetic field sensor on a single die. Additionally, embodiments of the method provide a process and system that are compatible with conventional process technology without substantial modifications to conventional equipment and processes. Preferably, embodiments of the invention provide for an improved sensors and electronic devices and related methods for a variety of uses.

Following step 602, fabrication method 600 involves providing a substrate having a surface region, step 604. The substrate can include a substrate-on-insulator (SOI) substrate. In specific embodiment, the substrate can include an epitaxial (EPI) material. In further embodiments, the substrate can have a silicon, single crystal silicon, or polycrystalline silicon material. The substrate can also include metals, dielectrics, polymers, and other materials and combinations thereof. At least one insulation material can be formed overlying at least one portion of the surface region, step 606. The insulation material(s) can be formed from dielectric materials, oxide materials, or other materials and combinations thereof.

At least one permalloy material can be formed overlying the insulation material(s), step 608. In a specific embodiment, the permalloy material(s) can include a nickel iron (NiFe) material a nickel iron cobalt (NiFeCo) material, or other permalloy material or combination thereof. In various embodiments, permalloy may include a nickel iron magnetic alloy typically having about 20% iron and 80% nickel content." In a specific embodiment, the permalloy material(s) can be formed via an electric plating process or sputtering process.

At least one first metal material can be formed overlying at least one portion of the permalloy material(s) and the surface region, step 610. The first metal material(s) can include aluminum, or copper, or a metal alloy, other metal material or combination thereof. A first dielectric material can be formed overlying the first metal material(s) and the surface region, step 612. The first dielectric material can include a silicon oxide material, or other oxide material, or combination thereof. At least one second metal material can be formed overlying at least one portion of the first dielectric material, step 614. The second metal material(s) can include materials similar to those in the first metal material(s).

A second dielectric material can be formed overlying the second metal material(s) and at least one portion of the first dielectric material, step 616. The third dielectric material can include materials found in the dielectric materials mentioned previously. At least one third metal material, which can include similar materials used in the metal materials mentioned previously, can be formed overlying at least a portion of the fourth dielectric material, step 618. At least one passivation material can then be formed overlying the third metal material(s) and the second dielectric material, step 620. The passivation material(s) can include dielectric materials, oxide materials, or silicon materials, or other materials or combinations thereof.

The above sequence of processes provides a fabrication method for forming a three-axis magnetic field sensing device according to an embodiment of the present invention. As shown, embodiments of the method disclose a combination of steps including providing a substrate, forming permalloy materials, forming metal materials, forming dielectric materials, and forming passivation materials. Other alternatives can also be provided where steps are added, one or more steps are removed, or one or more steps are provided in a different sequence without departing from the scope of the claims herein.

Figure 7:
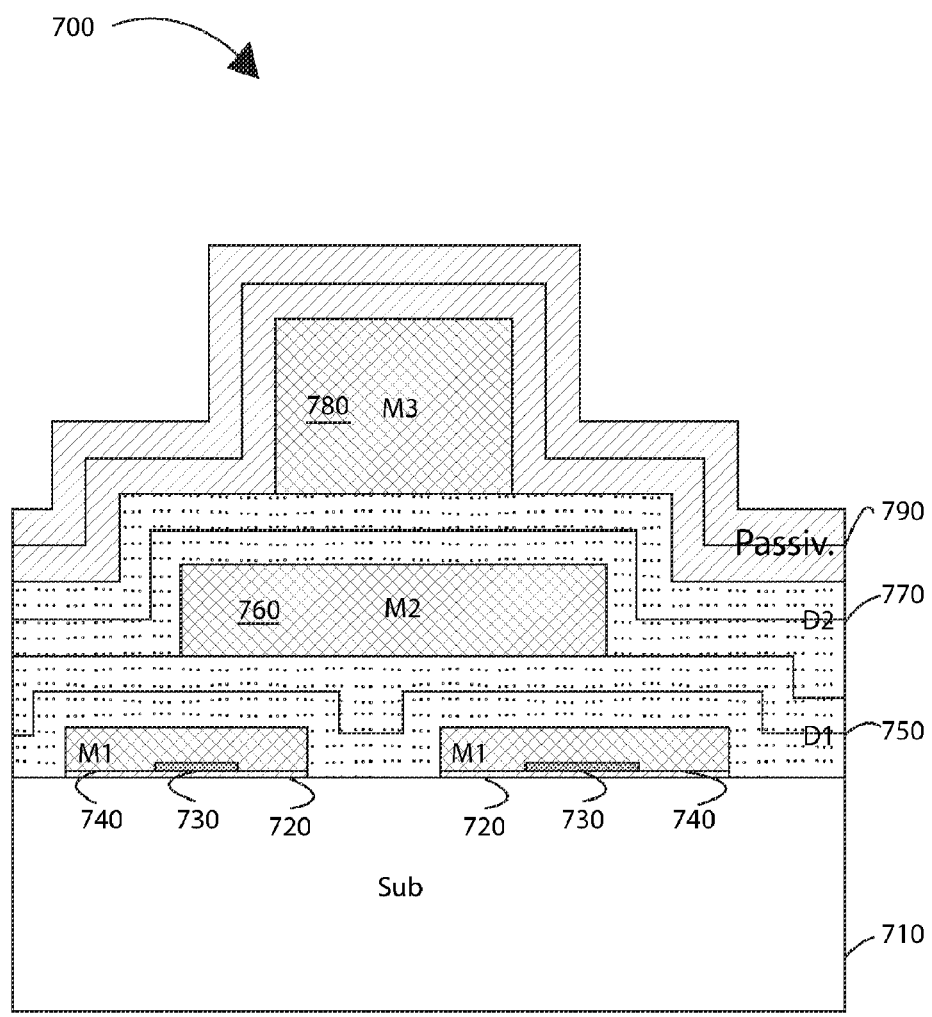
FIG. 7 is a simplified cross-sectional diagram of a device for sensing magnetic fields according to an embodiment of the present invention.

FIG. 7 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 700 includes a substrate 710, insulation material(s) 720, permalloy material(s) 730, metal materials {740, 760, 780}, dielectric materials {750,780}, and passivation material(s) 790.

In an embodiment, substrate 710 can include a substrate-on-insulator (SOI) substrate. In specific embodiment, the substrate can include an epitaxial (EPI) material. In further embodiments, substrate 710 can have a silicon, single crystal silicon, or polycrystalline silicon material. Substrate 710 can also include metals, dielectrics, polymers, and other materials and combinations thereof. Insulation material(s) 720 can include dielectric materials, oxide materials, silicon materials, or other materials and combinations thereof.

In a specific embodiment, permalloy material(s) 730 can include a nickel iron (NiFe) material, a nickel iron cobalt (NiFeCo) material, or other permalloy material or combination thereof. According to Wikipedia, "permalloy is a term for a nickel iron magnetic alloy typically having about 20% iron and 80% nickel content." Permalloy material(s) 730 can be formed via an electric plating process or sputtering process.

In an embodiment, at least one first metal material 740 can be formed overlying at least one portion of permalloy material(s) 730 and the surface region. First metal material(s) 740 can include aluminum, or copper, or a metal alloy, other metal material or combination thereof. A first dielectric material 750 can be formed overlying the first metal material(s) and the surface region. First dielectric material 750 can include a silicon oxide material, or other oxide material, or combination thereof. At least one second metal material 760 can be formed overlying at least one portion of first dielectric material 750. Second metal material(s) 760 can include materials similar to those in first metal material(s) 740.

A second dielectric material 770 can be formed overlying second metal material(s) 760 and at least one portion of first dielectric material 750. Second dielectric materials 770 can include materials found in the first dielectric material mentioned previously. At least a third metal material 780, which can include similar materials used in the metal materials mentioned previously, can be formed overlying at least a portion of second dielectric material 780. At least one passivation material 790 can then be formed overlying third metal material(s) 780 and second dielectric material 770. Passivation material(s) 790 can include dielectric materials, oxide materials, or silicon materials, or other materials or combinations thereof.

Figure 8:
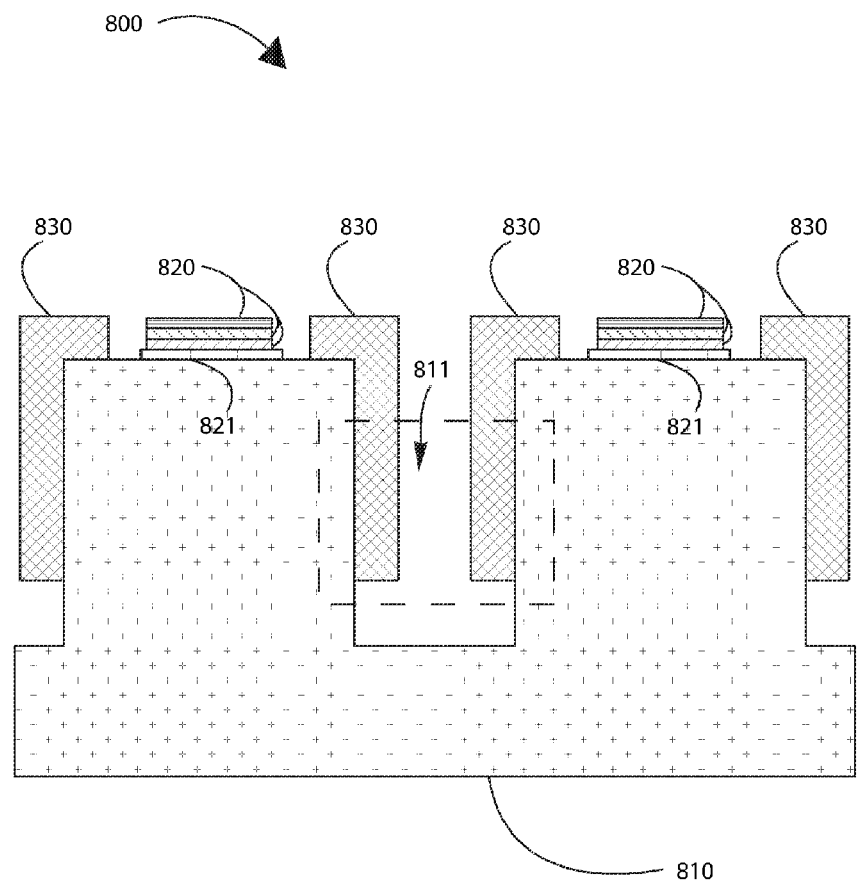
FIG. 8 is a simplified cross-sectional diagram of a device for sensing magnetic fields according to an embodiment of the present invention.

FIG. 8 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 800 includes a substrate 810, at least one application specific integrated circuit (ASIC) material 821, at least one magnetic field sensing element 820, and at least one magnetic field concentrator 830.

In an embodiment, substrate 810 can have a top surface region. In a specific embodiment, substrate 810 can include a buried oxide (BOX) substrate. Substrate 810 can include a substrate-on-insulator (SOI) substrate. In another specific embodiment, substrate 810 can include an epitaxial (EPI) material. In further embodiments, substrate 810 can have a silicon, single crystal silicon, or polycrystalline silicon material. Substrate 810 can also include other materials and combinations thereof.

In an embodiment, substrate 810 can have at least one portion removed to form at least one lateral surface region, as shown by region 811. The removal of portion(s) of substrate 810 can include a wet etching, dry etching, or mechanical process. In a specific embodiment, the removal of portion(s) of substrate 810 can include a deep reactive-ion etching (DRIE) process. The removal process can include other processes and combinations thereof. In an embodiment, device 800 can include an insulating material, which can be formed overlying at least one portion of the top surface region of substrate 810. In an embodiment, the insulating material can be formed overlying at least one portion of the lateral surface region(s). ASIC material 821 can be formed overlying at least one portion of substrate 810. In various embodiments, ASIC material 821 can include a variety of ICs related to signal conditions and the like.

In an embodiment, magnetic field sensor element(s) 820 can be formed overlying at least one portion of the top surface region. Magnetic field sensor element(s) 820 can include ordinary magneto-resistive (OMR) device(s), anisotropic magneto-resistive (AMR) device(s), giant magneto-resistive (GMR) device(s), or tunnel junction magneto-resistive (TMR) device(s). The device(s) 820 can also be other types of magnetic field sensor device(s), sensors, or combinations thereof. In a specific embodiment, magnetic field sensor element(s) 820 can include thin film devices that can be deposited overlying at least one portion of the top surface region. The thin film device(s) can be deposited by a sputtering process or an electric plating process. In a specific embodiment, magnetic field sensor element(s) 820 are formed through as a Wheatstone bridge, a half bridge, or a single element configuration. In an embodiment, magnetic field sensor element(s) 820 can include at least one layer of dielectric material and/or metal material.

In an embodiment, magnetic field concentrator(s) 830 can be formed overlying at least one portion of the lateral surface region(s). In an embodiment, magnetic field concentrator(s) 830 can also be spatially formed overlying at least one portion of the top surface region. In a specific embodiment, magnetic field concentrator(s) 830 can include a nickel-iron material. Magnetic field concentrator(s) 830 can also include other materials, compositions, and combinations thereof. Magnetic field concentrator(s) 830 can include permalloy material having high permeability. In various embodiments, the material for magnetic field concentrators 830 may be the same as the material for magnetic field sensor elements 820, and may be deposited in the same operation. Subsequently, using conventional etching processes, magnetic field concentrators 830 and magnetic field sensor elements 820 may then be separated or defined. In a specific embodiment, magnetic field concentrator(s) 830 can be formed via an electric plating process or sputtering process. Then, a passivation material can be formed overlying at least magnetic field sensor element(s) 820.

Figure 9:
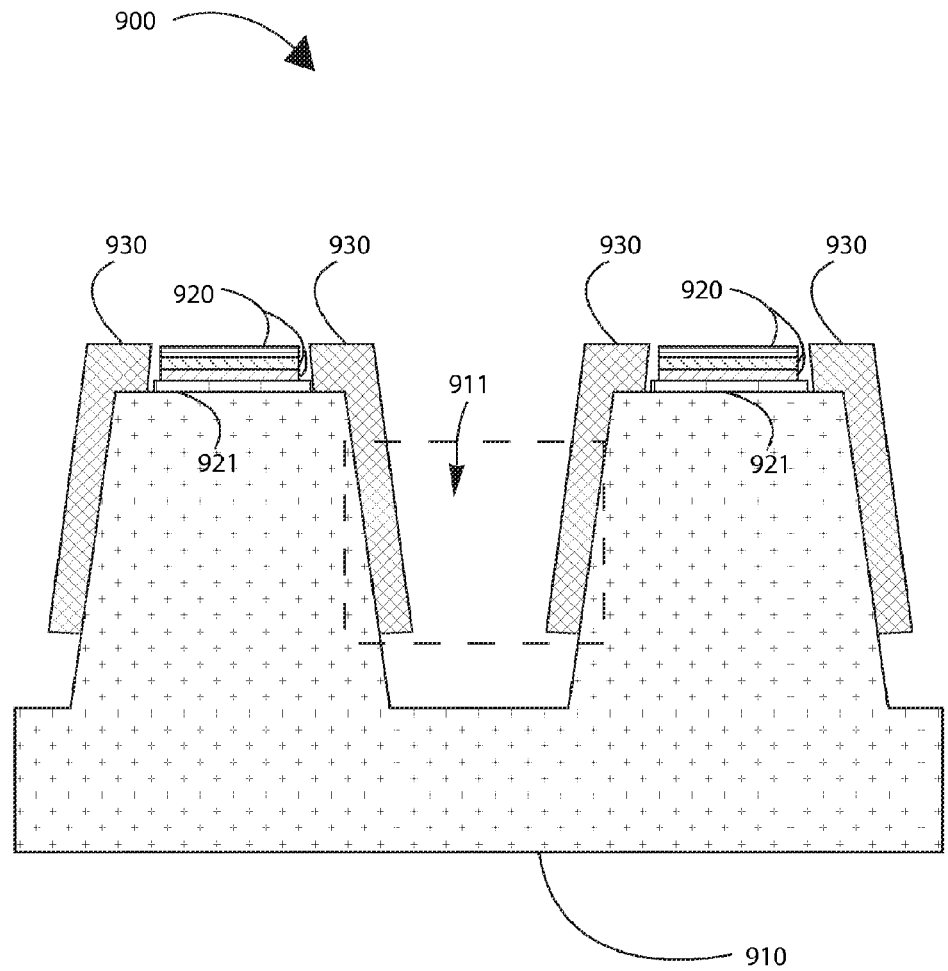
FIG. 9 is a simplified cross-sectional diagram of a device for sensing magnetic fields according to an embodiment of the present invention.

FIG. 9 is a simplified side diagram of a sensor device or electronic device according to an embodiment of the present invention. Compared to FIG. 8, this diagram can represent another configuration of the device components. This diagram is merely an example, which should not unduly limit the scope of the claims herein. One of ordinary skill in the art would recognize many other variations, modifications, and alternatives. As shown, device 900 includes a substrate 910, at least one application specific integrated circuit (ASIC) material 921, at least one magnetic field sensing element 920, and at least one magnetic field concentrator 930. A detailed description regarding the elements of FIG. 9 can be found above in the description for FIG. 8.

Figure 10:
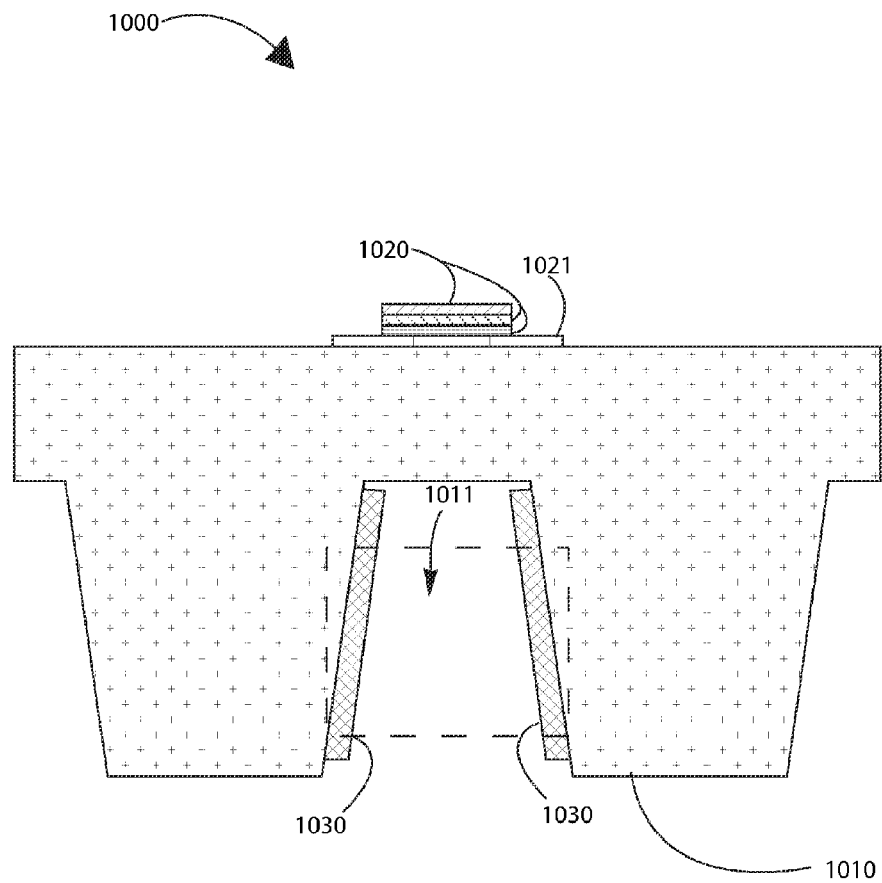
FIG. 10 is a simplified cross-sectional diagram of a device for sensing magnetic fields according to an embodiment of the present invention.

FIG. 10 is a simplified cross-sectional diagram of a sensor device or electronic device according to an embodiment of the present invention. Compared to the previous two figures, FIG. 10 can represent yet another configuration of the device components. This diagram is merely an example, which should not unduly limit the scope of the claims herein. One of ordinary skill in the art would recognize many other variations, modifications, and alternatives. As shown, device 1000 includes a substrate 1010, at least one application specific integrated circuit (ASIC) material 1021, at least one magnetic field sensing element 1020, and at least one magnetic field concentrator 1030. A detailed description regarding the elements of FIG. 10 can be found above in the description for FIG. 8.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a device for sensor magnetic fields, the method comprising:
    providing a substrate member having a surface region;
    removing at least one portion of the substrate member;
    forming an integrated circuit (IC) layer overlying the substrate member;
    forming a first magnetic field sensor element comprising at least a first material and configured to detect at least an x-axis direction, the first magnetic field sensor element being operably coupled to the IC layer;
    forming a second magnetic field sensor element comprising at least the first material and configured to detect at least a y-axis direction, the second magnetic field sensor element being operably coupled to the IC layer;
    forming a third magnetic field sensor element comprising at least the first material and configured to detect at least a z-axis direction, the third magnetic field sensor element being operably coupled to the IC layer;
    forming at least one magnetic field concentrator spatially disposed overlying at least one portion of the substrate member, the magnetic field concentrator being formed within a vicinity of the third magnetic field sensor element; and
    forming at least one passivation material overlying the first, second, and third magnetic field sensor elements and the surface region;
    wherein all of the x-axis, y-axis, and z-axis directions are configured in a mutually orthogonal manner.

2. The method of claim 1 wherein the substrate member comprises a silicon material, a dielectric material, or a polymer.

3. The method of claim 1 wherein the substrate member has at least one portion patterned through a wet etching, dry etching, deep reactive-ion etching (DRIE), or mechanical process.

4. The method of claim 1 wherein the IC layer comprises a silicon material, a dielectric material, or a metal material.

5. The method of claim 1 wherein the IC layer comprises at least one IC device.

6. The method of claim 1 wherein the first, second, and third magnetic field sensor elements comprise ordinary magneto-resistive (OMR) devices, anisotropic magneto-resistive (AMR) devices, giant magneto-resistive (GMR) devices, or tunnel junction magneto-resistive (TMR) devices.

7. The method of claim 1 wherein the first, second, and third magnetic field sensor elements comprise thin film device(s), the thin film device(s) being deposited overlying at least one portion of the surface region.

8. The method of claim 7 wherein the thin film device(s) are deposited by a sputtering process.

9. The method of claim 1 wherein the first, second, and third magnetic field sensor elements are formed as a Wheatstone bridges, half bridges, or single elements.

10. The method of claim 1 wherein the first magnetic field sensor element is configured to be 45 degrees away from a crystal easy axis direction.

11. The method of claim 1 wherein the first magnetic field sensor element is configured to detect magnetic fields in the x-axis direction.

12. The method of claim 1 wherein the second magnetic field sensor element is configured to be −45 degrees away from a crystal easy axis direction.

13. The method of claim 1 wherein the second magnetic field sensor element is configured to detect magnetic fields in the y-axis direction.

14. The method of claim 1 wherein the first and second magnetic field sensor elements are configured to be symmetrical across a crystal hard axis.

15. The method of claim 1 wherein the third magnetic field sensor is configured to a direction on a crystal hard axis or a crystal easy axis.

16. The method of claim 1 wherein the third magnetic field sensor element is aligned to the first or second magnetic sensor element.

17. The method of claim 1 wherein the third magnetic field sensor element is configured to detect magnetic fields in the z-axis direction, the third magnetic field sensor element being able to detect vertical magnetic fields via the field concentrator(s).

18. The method of claim 1 further comprising a conductive strap disposed within a vicinity of the first, second, and third magnetic field sensor elements.

19. The method of claim 18 wherein the conductive strap comprises a metal or metal alloy.

20. The method of claim 1 wherein the field concentrator(s) comprise a nickel iron (NiFe) material or a nickel iron cobalt (NiFeCo) material.

21. The method of claim 1 wherein the field concentrator(s) comprise permalloy materials, the permalloy materials having high permeability.

22. The method of claim 1 wherein the field concentrator(s) are formed via an electricplating process or a sputtering process.

\* \* \* \* \*